United States Patent [19]
Hsu

[11] Patent Number: 5,972,770
[45] Date of Patent: Oct. 26, 1999

[54] METHOD OF MANUFACTURING A DRAM CAPACITOR

[75] Inventor: Chen-Chung Hsu, Taichung, Taiwan

[73] Assignee: United Microelectronics Corp., Taiwan

[21] Appl. No.: 09/093,874

[22] Filed: Jun. 9, 1998

Related U.S. Application Data

[62] Division of application No. 08/900,062, Jul. 23, 1997.

[30] Foreign Application Priority Data

Apr. 22, 1997 [TW] Taiwan ................... 86105176

[51] Int. Cl.⁶ .................................................. H01L 21/20
[52] U.S. Cl. ........................................... 438/396; 438/253
[58] Field of Search .................................. 438/253, 254, 438/255, 256, 396, 397, 398, 399; 257/306, 309

[56] References Cited

U.S. PATENT DOCUMENTS

| | | | |
|---|---|---|---|
| 5,834,357 | 11/1998 | Kang | 438/253 |
| 5,879,987 | 3/1999 | Wang | 438/254 |
| 5,903,024 | 5/1999 | Hsu | 438/254 |

*Primary Examiner*—Tuan H. Nguyen
*Attorney, Agent, or Firm*—Rabin & Champagne, PC

[57] ABSTRACT

A DRAM capacitor and a method of making the same includes the provisions of providing a semiconductor substrate having a MOS transistor with a gate and source/drain regions formed thereabove. A first insulating layer covers the semiconductor substrate. A conducting plug is formed in the first insulating layer. Thereafter, a multi-layered structure is formed above the first insulating layer and the conducting plug, with at least one pair of alternately formed layers, including a first conducting layer followed by a second insulating layer. Then, an opening is formed through the multi-layered structure to expose the conducting plug. Subsequently, a pattern is etch-defined on the multi-layered structure to expose part of the first insulating layer. After that, part of the second insulating layer is etched away, to shape the multi-layered structure into a cross-sectional profile similar to two towers, each in the form of a vertical stack of Ts, with each tower standing side-by-side and adjacent to each other. Next, a lower electrode layer is formed over the surfaces of the multi-layered structure as well as the exposed surface of the conducting plug. A dielectric layer is formed over the lower electrode layer. An upper electrode layer is formed over the dielectric layer.

14 Claims, 10 Drawing Sheets

1

METHOD OF MANUFACTURING A DRAM CAPACITOR

This is a division of copending application Ser. No. 08/900,062, filed Jul. 23, 1997.

BACKGROUND OF THE INVENTION

1. Field of Invention

This invention relates in general to a structure and a method of manufacturing a dynamic random-access-memory (DRAM) capacitor. More particularly, this invention relates to a structure and a method of manufacturing a stacked-type capacitor, as well as an improved combination of a stacked- and trench-type capacitor.

2. Description of Related Art

DRAM is a-type of volatile memory having a signal which is stored in a digital state, depending on the charging state of the capacitor, in each memory cell. FIG. 1 is a circuit diagram of a conventional DRAM cell, which comprises a metal-oxide-semiconductor (MOS) transistor 11 having a gate connected to a word line (WL). One end of a source/drain region is connected to a bit line (BL), while the other end of the source/drain region connected to ground via a capacitor 12. The digital signal of the DRAM cell is stored in the capacitor 12. The storage capacity for the digital signal increases with an increase in the charge stored in the capacitor 12. Furthermore, if the charge is increased, signal read out from the memory, using amplification circuits during a read operation, will be less affected by noise. For example, soft errors generated by α-particles will be greatly reduced.

There are several conventional methods of increasing the charge storage capacity of a capacitor. For example, by increasing the surface area of the conducting layer in the capacitor, or by reducing the thickness of the dielectric layer in the capacitor, the amount of charge capable of being stored in the capacitor can be increased. The stacked-type capacitor, as shown in FIGS. 2 through 4, is an example of a capacitor structure having an increased capacitor area.

FIG. 2 is a cross-sectional view of a conventional stacked-type DRAM capacitor structure. First, a semiconductor substrate 20 having a MOS transistor 22, a field oxide layer 26 and a conducting layer 27 formed thereabove, is provided. The MOS transistor 22 comprises a gate 23, source/drain regions 24 and spacers 25. Then, an insulating layer 28 is deposited. This is followed by etching the insulating layer 28 to form contact openings above designated source/drain regions 24. Thereafter, a lower electrode layer 29, a dielectric layer 210 and an upper electrode layer 211 are sequentially formed above the contact window. Lower electrode layer 29, dielectric layer 210 and upper electrode layer 211 form a stacked-type capacitor structure 212.

The dielectric layer 210 can be a silicon nitride/silicon oxide (NO) composite layer, or a silicon oxide/silicon nitride/silicon oxide (ONO) composite layer. The lower electrode layer 29 and the upper electrode layer 211 can each be a polysilicon layer.

Finally, back-end processes, such as the formation of a metallic contact window 213 and the laying of a passivation layer (not shown in the figure), are performed to complete the fabrication of the DRAM structure.

FIG. 3 is a cross-sectional view of a second conventional stacked-type DRAM capacitor structure. First, a semiconductor substrate 30, having a MOS transistor 32, a field oxide layer 36 and a conducting layer 37 formed thereabove, is provided. The MOS transistor 32 is comprised of a gate 33, source/drain regions 34 and spacers 35. Then, an insulating layer 38 is deposited. This is followed by etching the insulating layer 38 to form contact openings above designated source/drain regions 34. Thereafter, a lower electrode layer 39, a dielectric layer 310 and an upper electrode layer 311 are sequentially formed above the contact window. Lower electrode layer 39, dielectric layer 310 and upper electrode layer 311 together form a stacked-type capacitor structure 312.

The dielectric layer 310 can be a silicon nitride/silicon oxide (NO) composite layer or a silicon oxide/silicon nitride/silicon oxide (ONO) composite layer. The lower electrode layer 39 and the upper electrode layer 311 can each be a polysilicon layer. Additionally, the lower electrode layer 39 has an irregular up-and-down surface profile.

Finally, back-end processes, such as the formation of a metallic contact window 313 and the laying of passivation layer (not shown in the figure), are performed to complete the fabrication of the DRAM structure.

FIG. 4 is a cross-sectional view of a third conventional stacked-type DRAM capacitor structure. First, a semiconductor substrate 40, having a MOS transistor 42, a field oxide layer 46 and a conducting layer 47 formed thereabove, is provided. The MOS transistor 42 is comprised of a gate 43, source/drain regions 44 and spacers 45. Then, an insulating layer 48 is deposited. This is followed by etching the insulating layer 48 to form contact openings above designated source/drain regions 44. Thereafter, a lower electrode layer 49, a dielectric layer 410 and an upper electrode layer 411 are sequentially formed above the contact window. Lower electrode layer 49, dielectric layer 410 and upper electrode layer 411 together form a stacked-type capacitor structure 412.

The dielectric layer 410 can be a silicon nitride/silicon oxide (NO) composite layer or a silicon oxide/silicon nitride/silicon oxide (ONO) composite layer. The lower electrode layer 49 and the upper electrode layer 411 can each be a polysilicon layer. Additionally, the lower electrode layer 49 has an undulating surface profile to increase the surface area of the capacitor structure 412.

Finally, back-end processes, such as the formation of a metallic contact window 413 and the laying of a passivation layer (not shown in the figure), are performed to complete the fabrication of the DRAM structure.

The aforementioned stacked-type capacitor structures are currently the most common capacitor structures for DRAMs in use. These conventional methods all rely on improving the surface morphology of capacitors. Although the increase in surface area of the capacitor obtained by such methods increases its capacitance, the amount of such increase is limited, and is ineffective when applied to small dimensional components.

SUMMARY OF THE INVENTION

It is therefore an object of this invention to provide a DRAM capacitor and a method of manufacturing the same which greatly increases the surface area of the capacitor, thus effectively raising the capacitor's capacitance.

It is yet another object of the present invention to provide a capacitor having an increased capacitance, which is suitable in applications requiring components having small dimensions.

To achieve the above objects, a DRAM capacitor structure and its method of manufacturing includes the provision of providing a semiconductor substrate having a MOS transistor with a gate and source/drain regions formed thereabove. A first insulating layer covers the semiconductor substrate. Next, a conducting plug is formed in the first insulating layer. Thereafter, a multi-layered structure is formed. The multi-layered structure includes at least one pair of layers, including a first conducting layer followed by a second insulating layer above the first insulating layer and the conducting plug. Then, an opening is formed through the multi-layered structure to expose the conducting plug. Subsequently, a pattern is etch-defined on the multi-layered structure to expose part of the first insulating layer. After that, part of the second insulating layers is etched away to shape the multi-layered structure into a cross-sectional profile similar to two towers, each tower in the form of a vertical T, and each standing side-by-side. Next, a lower electrode structure is formed over the surfaces of the multi-layered structure as well as the exposed surface of the conducting plug. A dielectric layer is formed over the lower electrode layer. Finally, an upper electrode structure is formed over the dielectric layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1:
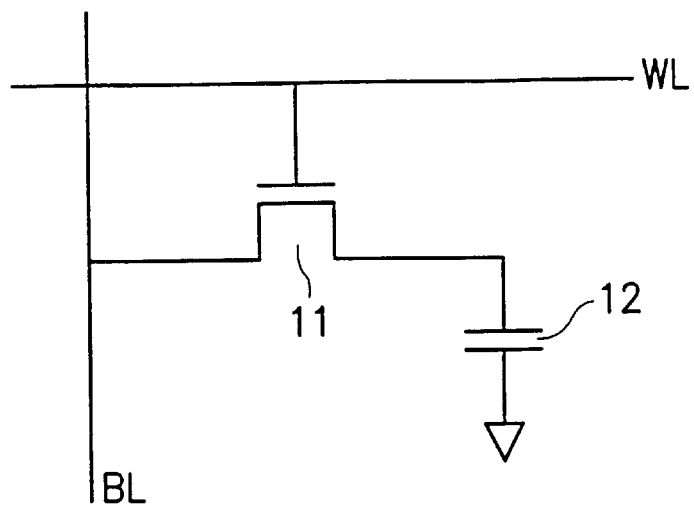
FIG. 1 is a circuit diagram for a conventional DRAM cell.
Figure 2:
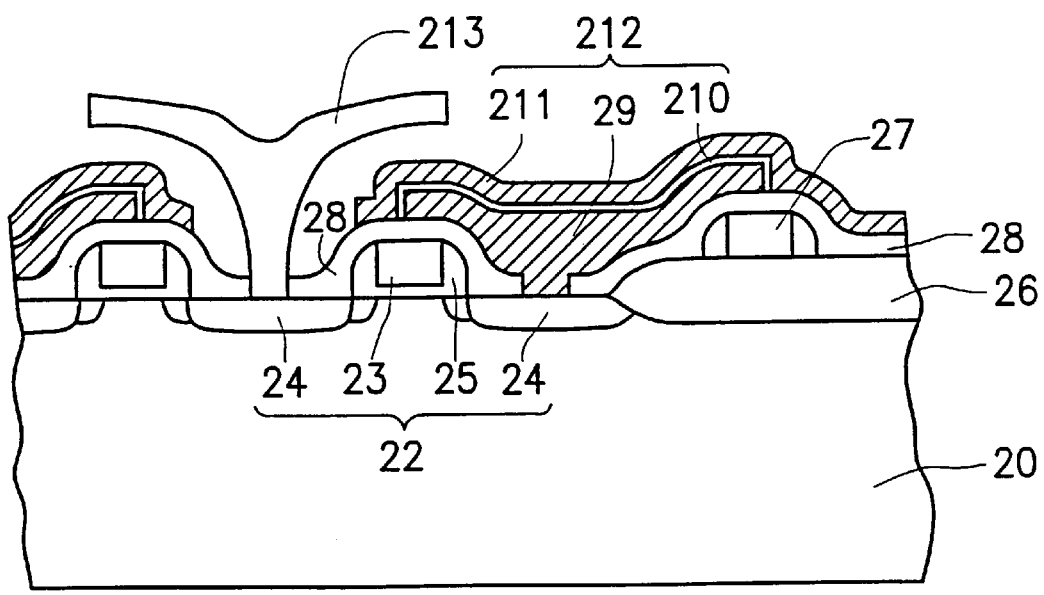
FIGS. 2 through 4 are cross-sectional views showing three respective types of conventional stacked DRAM capacitor structures.
Figure 3:
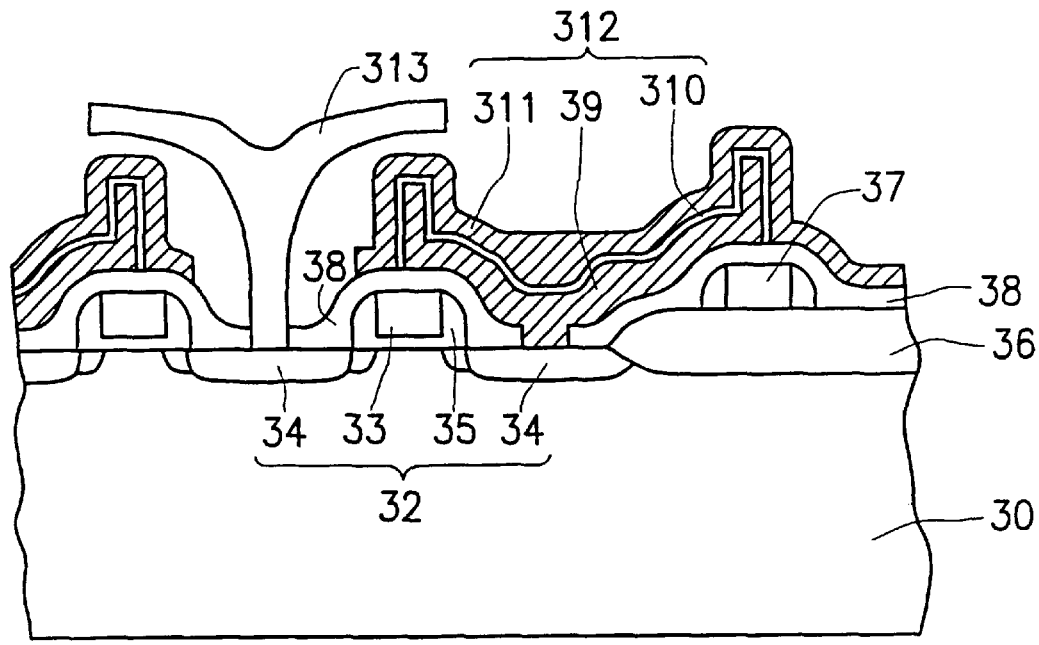
Figure 4:
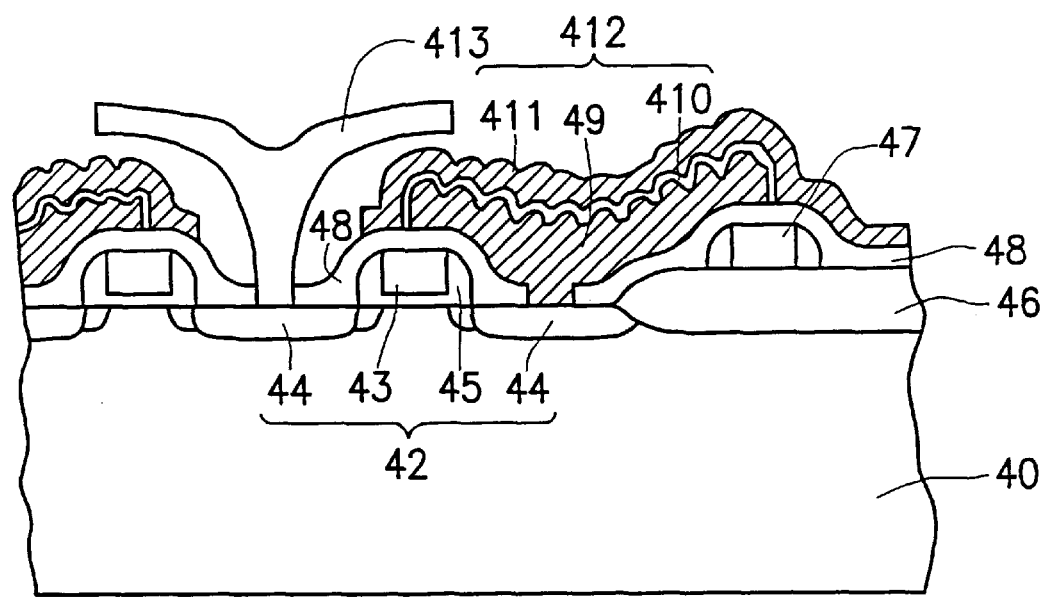
Figure 5A:
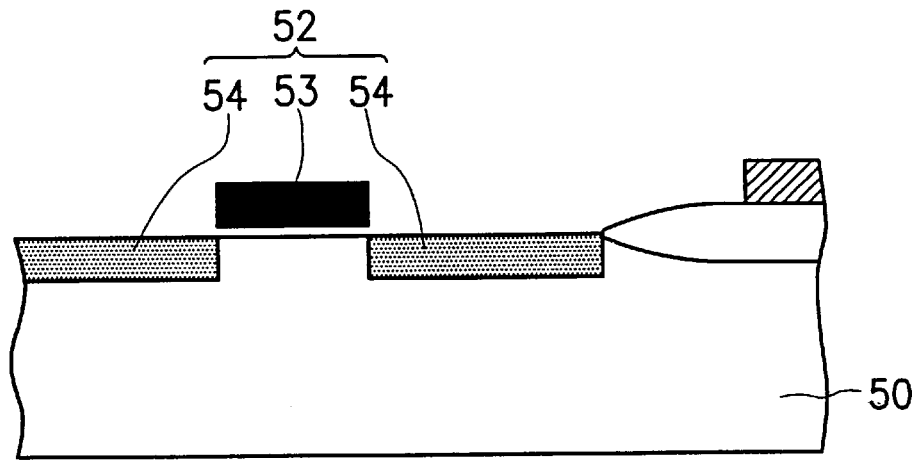
FIGS. 5A through 5G are a series of cross-sectional views outlining the manufacturing steps of a stacked-type DRAM capacitor, according to a first preferred embodiment of this invention.

Referring to FIG. 5A, a semiconductor substrate 50 having a MOS transistor 52 is provided. MOS transistor 52 includes a gate 53 and source/drain regions 54.

Figure 5B:
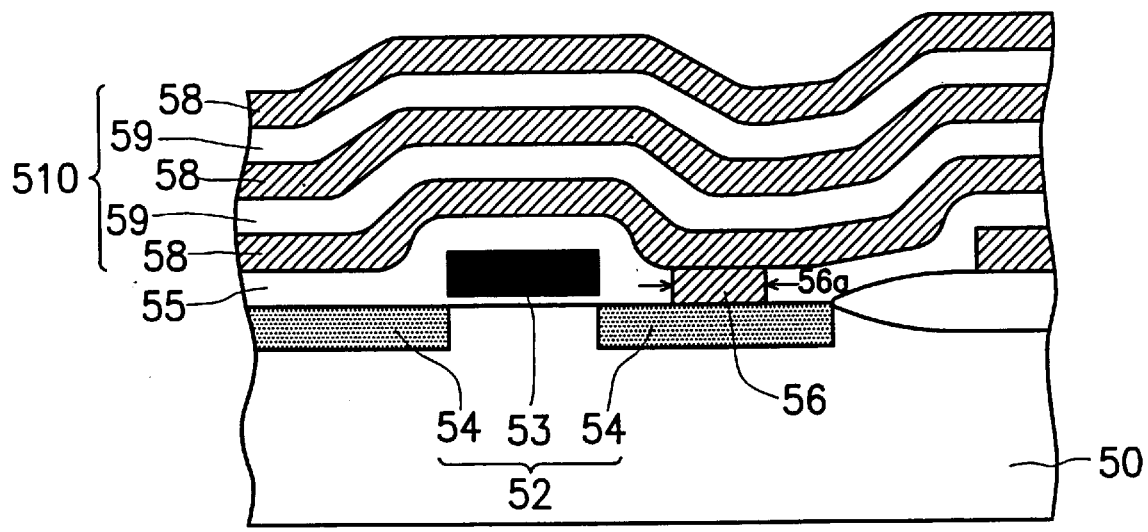

As shown in FIG. 5B, a first insulating layer 55 is deposited above the semiconductor substrate 50 using the reactive gas tetra-ethyl-ortho-silicate (TEOS). The first insulating layer 55 is preferably a borophosphosilicate glass (BPSG) layer having a thickness in the range of about 3000 Å to about 6000 Å. Then, the first insulating layer 55 is etched to form a contact window opening 56a therein. This is followed by filling the window 56a with a conducting material to form a conducting plug 56.

Thereafter, a multi-layered structure 510 is formed above the first insulating layer 55 and the conducting plug 56. The multi-layered structure includes at least one pair of alternately deposited layers, comprised of a first conducting layer 58 followed by a second insulating layer 59.

The first conducting layer 58 is preferably a doped polysilicon layer having a thickness in the range of about 500 Å to about 2000 Å. The second insulating layer 59 is preferably a nitride layer having a thickness in the range of about 2000 Å to about 4000 Å.

Figure 5C:
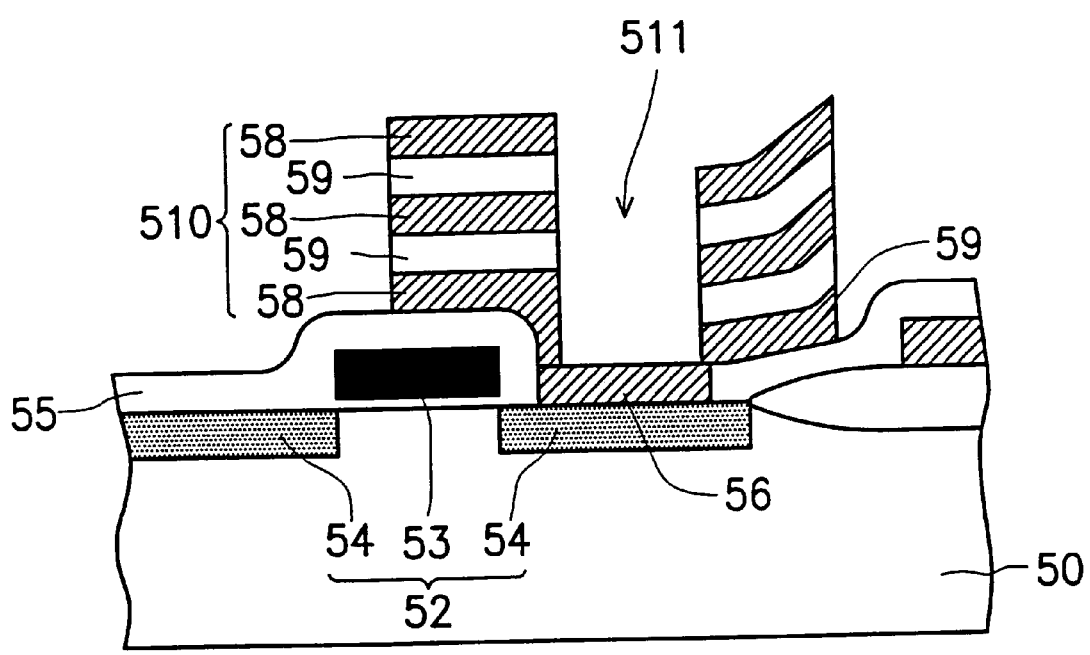

Referring next to FIG. 5C, anisotropic dry etching is used to etch the multi-layered structure 510 and form a centrally-located opening 511 therein. Opening 511 acts as a material receiving portion. The conducting plug 56 acts as an etching stop layer. Thereafter, the multi-layered structure 510 is etched and patterned, using the first insulating layer 55 as an etching stop layer, to form the multi-layered structure 510 as a hollow cylinder.

Figure 5D:
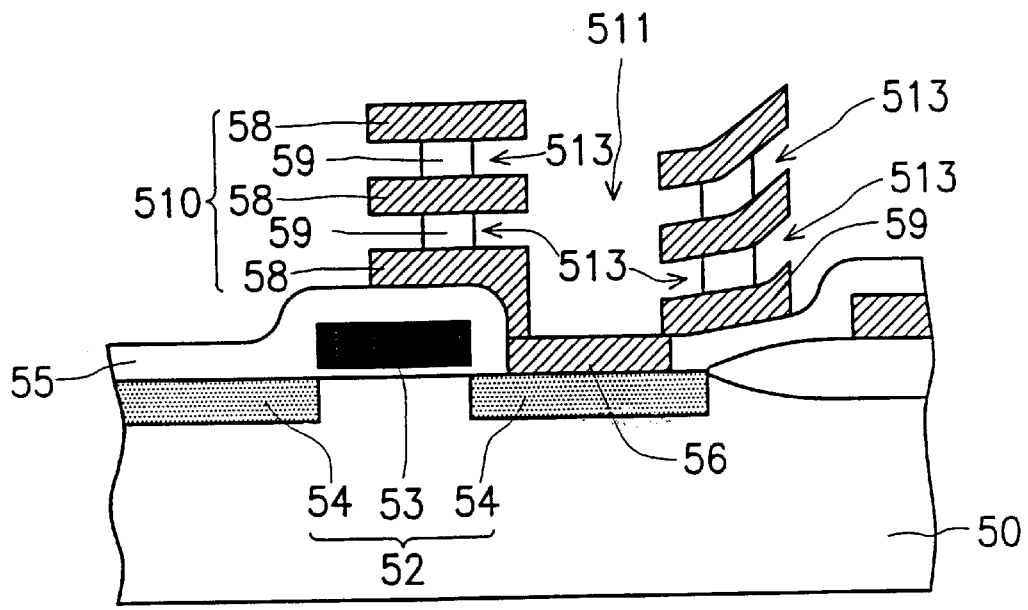

Referring to FIG. 5D, hot phosphoric acid ($H_3PO_4$) is used to wet etch and remove a portion of the second insulating layers 59, thus forming a plurality of trenches 513 on the sidewalls of the multi-layered structure 510. Trenches 513 each have depths which extend in the horizontal direction. This forms the multi-layered structure 510 with a cross-sectional profile similar to two adjacent towers. Each tower is in the form of a vertically extending stack of T's, i.e., T's stacked on top of one another in a vertical direction. Additionally, each tower is separated from the adjacent tower by an opening 511.

Figure 5E:
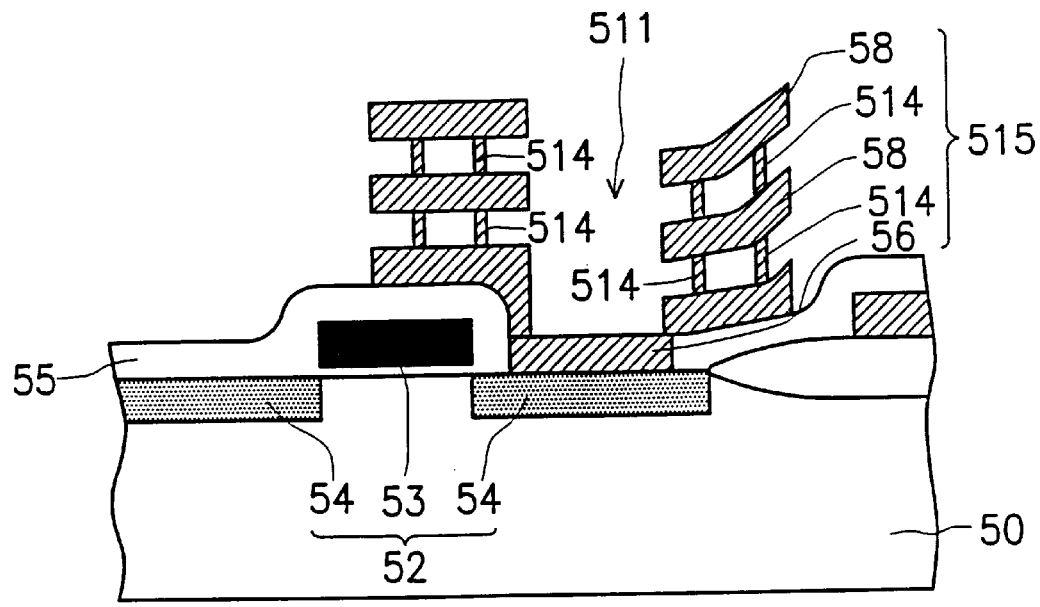

Referring to FIG. 5E, a second conducting layer 514, for example, a doped polysilicon layer having a thickness in the range of about 500 Å to about 1000 Å, is deposited over the surface of the multi-layered structure 510 and an exposed surface of the semiconductor substrate 50. The second conducting layer 514 electrically connects the first conducting layers 58 together. The polysilicon layer can be formed using chemical vapor deposition, and be doped with ions to increase its electrical conductivity. The second conducting layer 514, conducting plug 56 and first conducting layer 58 together form a lower electrode 515.

Figure 5F:
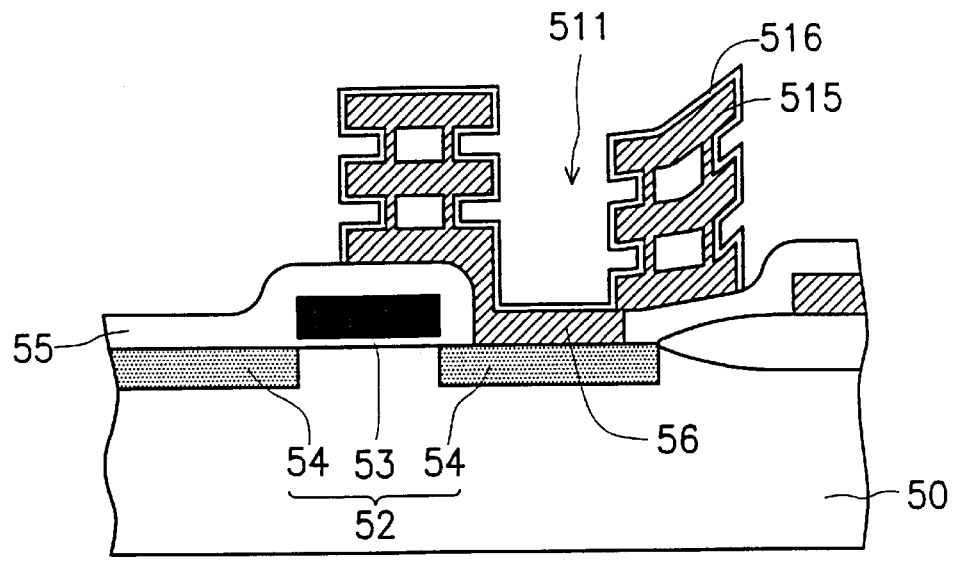

Referring to FIG. 5F, a dielectric layer 516, for example, a silicon oxide/silicon nitride/silicon oxide (ONO) composite layer, is deposited above the lower electrode 515 and within opening 511, to cover the source/drain region 54. The ONO composite layer can be formed by first heat growing a silicon oxide layer, then forming a silicon nitride layer on top of the silicon oxide layer, and finally performing a thermal oxidation process to form a silicon oxide layer above the silicon nitride layer. The dielectric layer 516 preferably has a thickness which is less than a thickness of the lower electrode 515. In general, the thickness of the dielectric layer 516 should not be greater than about 100 Å.

Figure 5G:
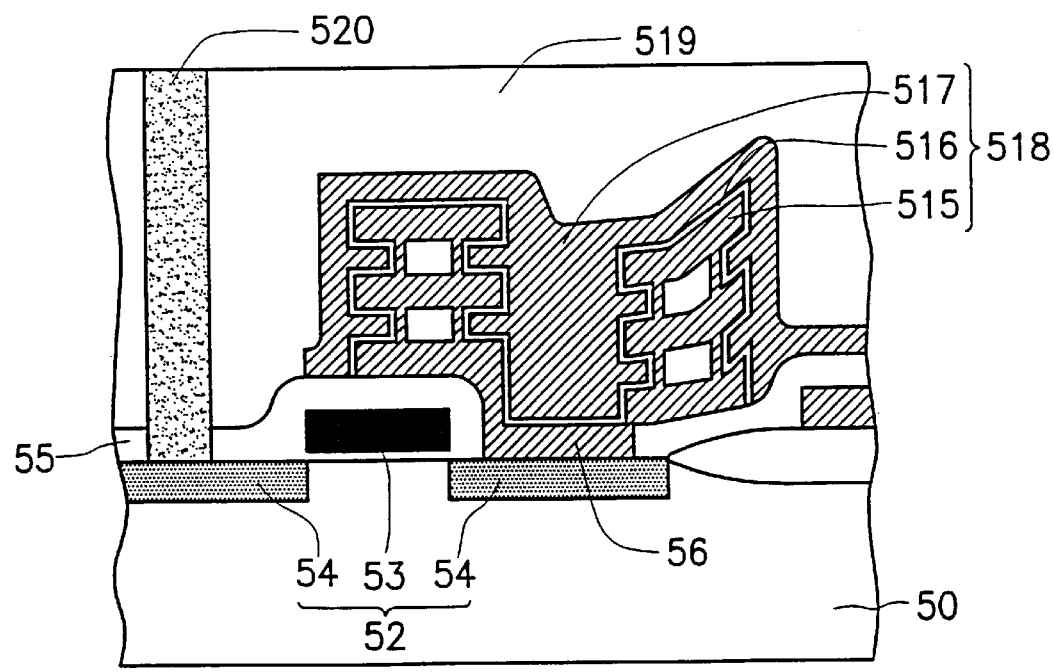

Referring to FIG. 5G, an upper electrode layer 517, for example, a doped polysilicon layer having a thickness in the range of about 1000 Å to about 3000 Å, is deposited above the dielectric layer 516. The polysilicon layer can be formed using chemical vapor deposition, and can be doped with ions to increase its electrical conductivity. The upper electrode layer 517 is electrically isolated from the lower electrode 515 by the dielectric layer 516. Thereafter, the upper electrode layer 517 is etched to define the boundaries of the stacked DRAM capacitor 518.

Finally, subsequent back end processes are performed, such as depositing a fourth insulating layer 519 for planarization. This can be followed by the formation of a metal interconnect 520, so as to complete the DRAM structure according to this invention.

FIGS. 6A through 6G are a series of cross-sectional views outlining the manufacturing steps of a DRAM capacitor, according to the second preferred embodiment of this invention. This capacitor is a combination trench-type and stacked-type capacitor.

Figure 6A:
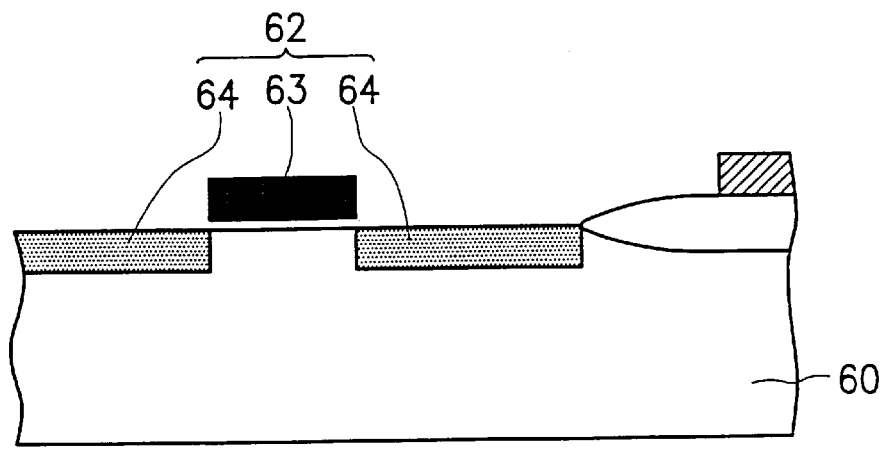
FIGS. 6A through 6G are a series of cross-sectional views outlining the manufacturing steps of a DRAM capacitor according to a second preferred embodiment of this invention.

Referring to FIG. 6A, a semiconductor substrate 60 having a MOS transistor 62 is provided. MOS transistor 62 includes a gate 63 and source/drain regions 64.

Figure 6B:
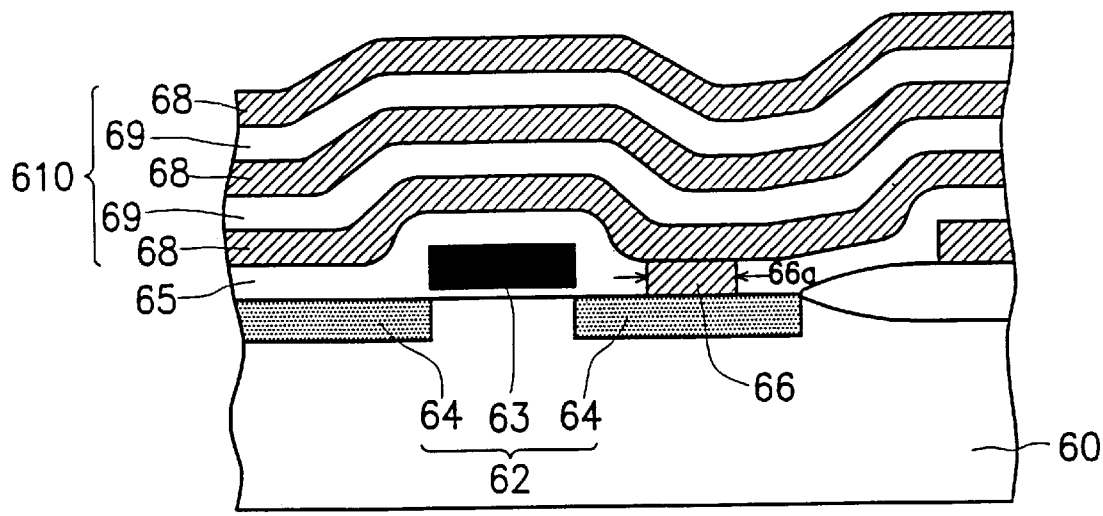

As shown in FIG. 6B, a first insulating layer 65 is deposited above the semiconductor substrate 60. The first insulating layer 65 is preferably a borophosphosilicate glass (13PSG) layer having a thickness in the range of about 3000 Å to about 6000 Å. Then, the first insulating layer 65 is etched to form a contact window opening 66a therein. This is followed by filling the window 66a with a conducting material to form a conducting plug 66.

Thereafter, a multi-layered structure 610 is formed above the first insulating layer 65 and the conducting plug 66. The multi-layered structure includes at least one pair of alternately deposited layers, comprised of a first conducting layer 68 followed by a second insulating layer 69. The first conducting layer 68 is preferably a doped polysilicon layer having a thickness in the range of about 500 Å to about 2000 Å. The second insulating layer 69 is preferably a nitride layer having a thickness in the range of about 2000 Å to about 4000 Å.

Figure 6C:
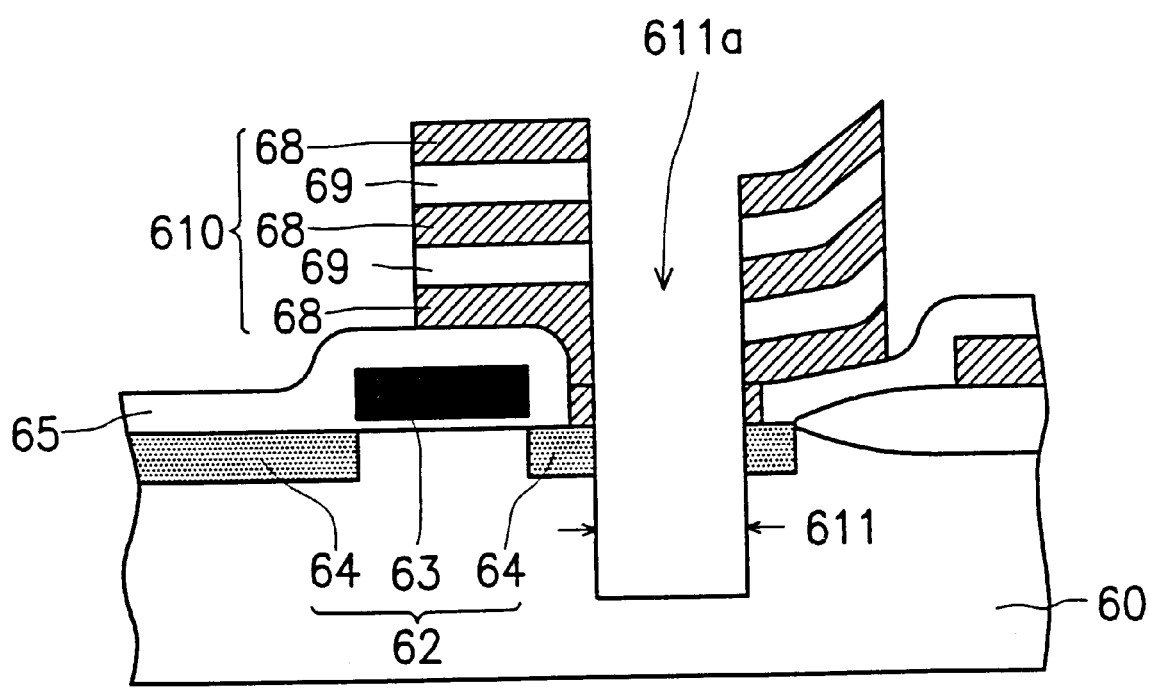

Referring next to FIG. 6C, anisotropic dry etching is used to etch the multi-layered structure 610 and the first insulating layer 65 to form an opening 611. The etching is continued in a downward direction, to form a first trench 611. Thereafter, the multi-layered structure 610 is etched and patterned, using the first insulating layer 65 as an etching stop layer, to form the multi-layered structure 610 as a hollow cylinder.

Figure 6D:
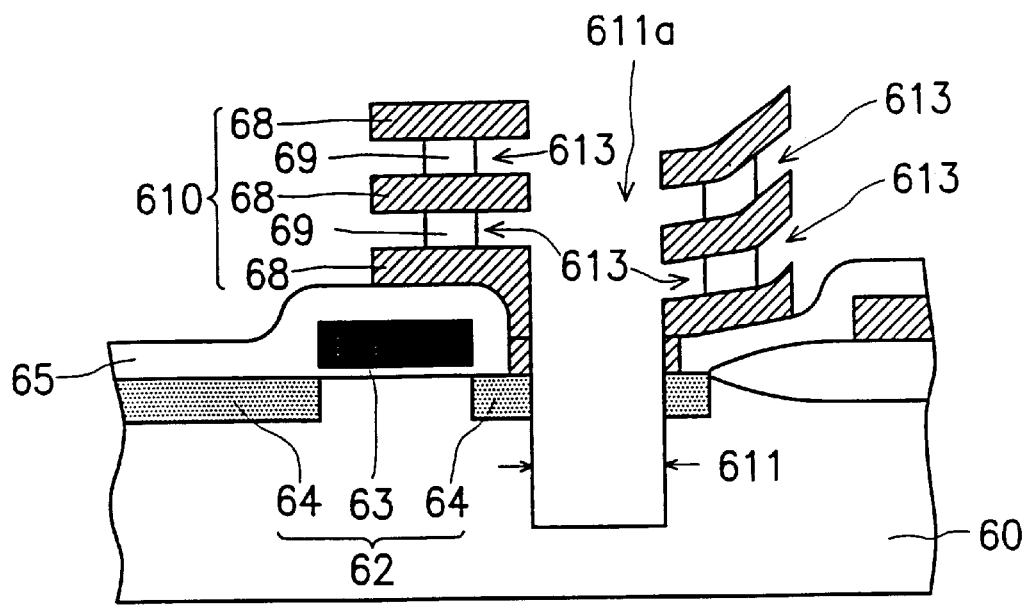

Referring to FIG. 6D, hot phosphoric acid ($H_3PO_4$) is used to wet etch and remove a portion of the second insulating layers 69, thus forming a plurality of trenches 613 on the sidewalls of the multi-layered structure 610. Trenches 613 each have depths which extend in the horizontal direction. This forms the multi-layered structure 610 with a cross-sectional profile similar to two adjacent towers. Each tower is in the form of a vertically extending stack of T's.

Figure 6E:
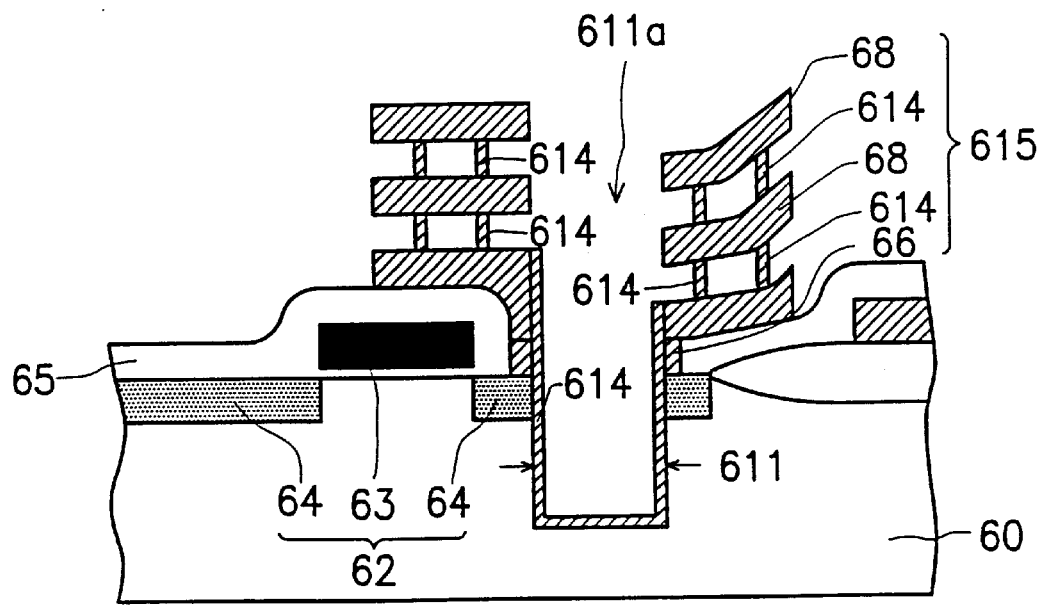

Referring to FIG. 6E, a second conducting layer 614, for example, a doped polysilicon layer, is deposited over the exposed surfaces of the second insulating layer 69 and at least two sidewalls of the first trench 611. The second conducting layer 614 electrically connects the first conducting layers 68 together. The polysilicon layer can be formed using chemical vapor deposition, and be doped with ions to increase its electrical conductivity. The second conducting layer 614, conducting plug 66 and first conducting layer 68 together form a lower electrode 615.

Figure 6F:
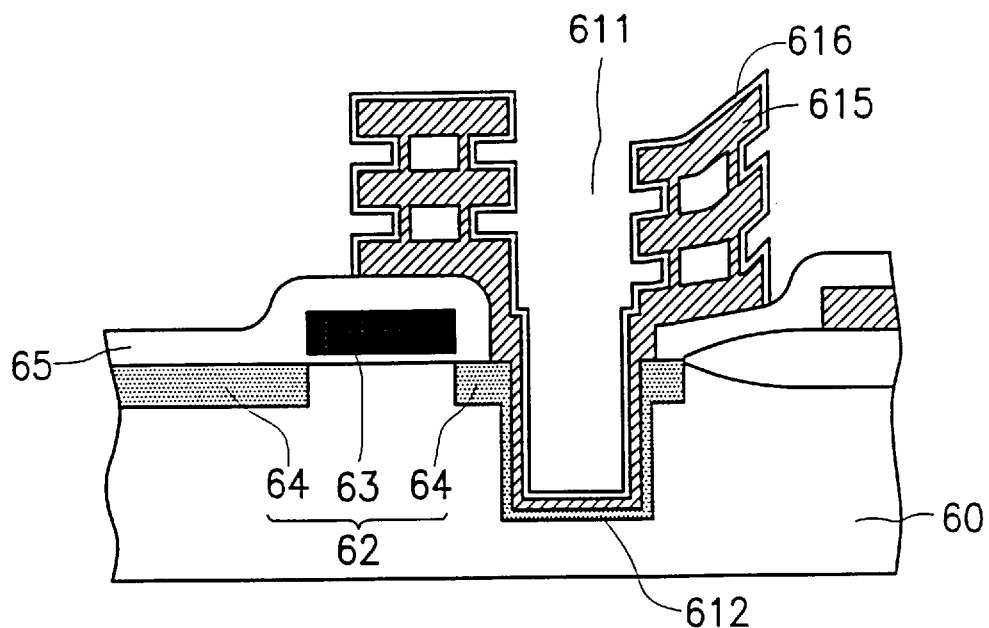

Thereafter, referring to FIG. 6F, an ion implantation operation is performed, for example, using N-type ions, to form a doped region 612 underneath the first trench 611. The doped region 612 is electrically connected with the source/drain region 64, so that the source/drain region 64 will not be divided into two separate regions as a result of the formation of the first trench 611.

Referring to FIG. 6F, a dielectric layer 616, for example, a silicon oxide/silicon nitride/silicon oxide (ONO) composite layer, is deposited above the lower electrode 615. The ONO composite layer can be formed by first heat growing a silicon oxide layer, then forming a silicon nitride layer on top of the silicon oxide layer, and finally performing a thermal oxidation process to form a silicon oxide layer above the silicon nitride layer. The dielectric layer 616 preferably has a thickness which is less than a thickness of the lower electrode 615. In general, the thickness of the dielectric layer 616 should not be greater than about 100 Å.

Figure 6G:
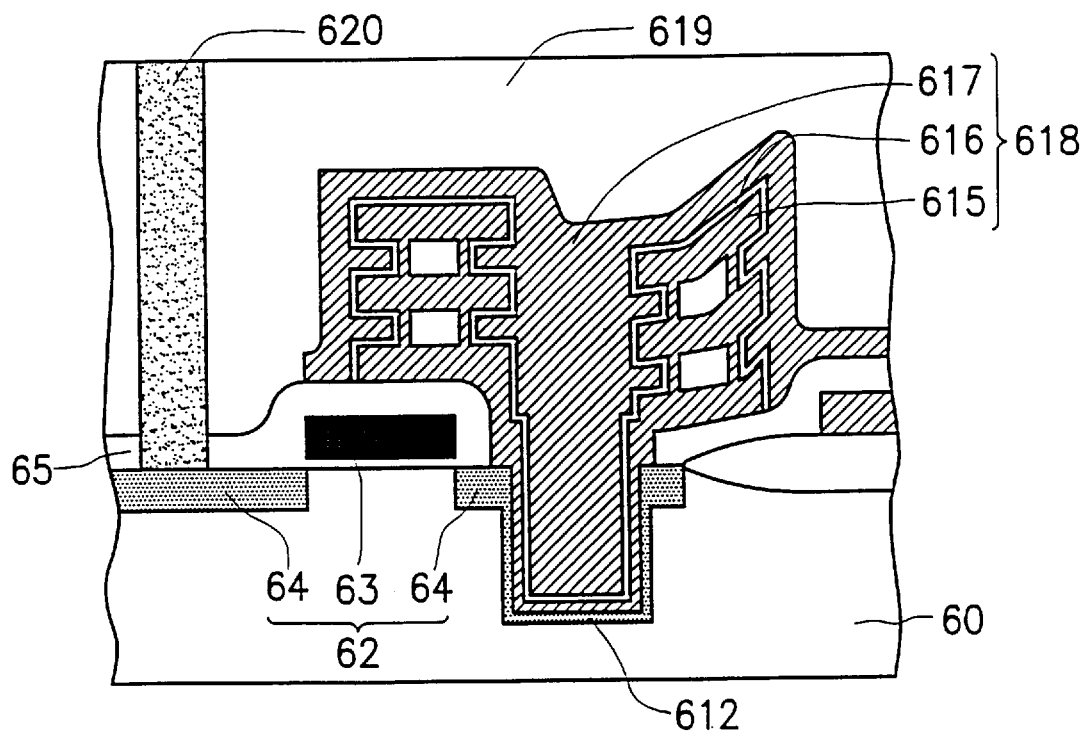

Referring to FIG. 6G, an upper electrode layer 617, for example, a doped polysilicon layer having a thickness in the range of about 1000 Å to about 3000 Å, is deposited above the dielectric layer 616. The polysilicon layer can be formed using chemical vapor deposition, and can be doped with ions to increase its electrical conductivity. The upper electrode layer 617 is electrically isolated from the lower electrode 615 by the dielectric layer 616. Thereafter, the upper electrode layer 617 is etched to define the boundaries of the stacked DRAM capacitor 618.

Finally, subsequent back end processes are performed, such as depositing a fourth insulating layer 619 for planarization. This can be followed by the formation of a metal interconnect 620 to complete the DRAM structure according to the present invention.

In summary, the manufacturing method according to the present invention has the following advantages:

(1) The multi-layered structure formed by repeatedly and alternately depositing a first conducting layer and a second insulating layer can greatly increase the surface area of the capacitor, thus greatly increasing the amount of charge capable of being stored in the capacitor.

(2) The manufacturing method has fewer steps than other conventional methods of making capacitor structures. Therefore, both production cost and production time are lower.

(3) Trench-type and stacked-type capacitors can be used together in the same capacitor. This flexibility allows for a tremendous increase in the surface area of the capacitor, and hence its charge storage capacity.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a stacked DRAM capacitor, comprising:

provideing a semiconductor substrate with a MOS transistor formed thereabove, the MOS transistor including a gate and source/drain regions;

covering the semiconductor substrate with a first insulating layer;

etching the first insulating layer to form a contact window opening therein and expose the source/drain region;

filling the contact window opening with a conducting material to form a conducting plug;

forming a multi-layered structure above the first insulating layer and the conducting plug, and comprised of alternately formed layers, including at least two first conducting layers and a second insulating layer sandwiched therebetween;

forming an opening in the multi-layered structure to expose the conductive plug;

etching and defining a pattern on the multi-layered structure using the first insulating layer as an etching stop layer;

etching the second insulating layer to form a plurality of trenches having depths which extend in a horizontal direction into respective sidewalls of the multi-layered structure, so that only a portion of the second insulating layer remains between the first conducting layers, thereby forming the multi-layered structure with a cross-sectional profile of two adjacent towers, with each tower having a profile of a plurality of T's stacked on top of one another in a vertical direction;

forming a second conducting layer over the multi-layered structure and an exposed surface of the semiconductor substrate, wherein the first conducting layers, the conducting plug and the second conducting layer together form a lower electrode;

forming a dielectric layer above the lower electrode; and forming an upper electrode above the dielectric layer.

2. The method according to claim 1, wherein said covering the semiconductor substrate includes using chemical vapor deposition.

3. The method according to claim 1, wherein said covering the semiconductor substrate includes covering the semiconductor substrate with a borophosphosilicate glass insulating layer.

4. The method according to claim 1, wherein said filling the contact window opening includes filling the contact window opening with a doped polysilicon layer to form the conducting plug.

5. The method according to claim 1, wherein said forming a multi-layered structure includes using chemical vapor deposition to form the second insulating layer.

6. The method according to claim 1, wherein said forming a multi-layered structure includes comprising the second insulating layer of silicon nitride.

7. The method according to claim 1, wherein said forming an opening includes using dry etching to form the opening.

8. The method according to claim 1, wherein said etching the second insulating layer includes wet etching using hot phosphoric acid as an etchant solution to form the plurality of trenches.

9. The method according to claim 1, wherein said forming a second conducting layer includes using chemical vapor deposition, with the second conducting layer being doped with ions to increase its electrical conductivity.

10. The method according to claim 1, wherein said forming a dielectric layer includes:

heat growing a silicon oxide layer;

forming a silicon nitride layer on top of the silicon oxide layer; and performing a thermal oxidation process to form a silicon oxide layer above the silicon nitride layer, thereby forming a silicon oxide/silicon nitride/silicon oxide composite dielectric layer.

11. The method according to claim 1, wherein said forming an upper electrode includes using chemical vapor deposition, with the upper electrode being doped with ions to increase its electrical conductivity.

12. The method according to claim 1, further comprising etching the lower electrode, the dielectric layer and the upper electrode layer to define a pattern.

13. The method according to claim 1, wherein said forming an opening further includes etching the conducting plug and the source/drain region to form a trench portion, with the lower electrode, the dielectric layer and the upper electrode all extending into the trench portion.

14. The method according to claim 13, wherein the trench portion divides the source/drain region into two portions; further comprising ion doping a bottom of the trench portion, after said forming a second conducting layer, to form a doped region at the bottom of the trench portion, wherein the doped region electrically connects the two portions of the source/drain region together.

* * * * *